(12) United States Patent
Lee et al.

(10) Patent No.: US 7,008,876 B2
(45) Date of Patent: Mar. 7, 2006

(54) METHOD OF FORMING GATE ELECTRODE STRUCTURE OF A SEMICONDUCTOR DEVICE

(75) Inventors: Woo-Sung Lee, Yongin (KR); Bong-Hyun Kim, Incheon (KR); Myang-Sik Han, Suwon (KR); Eun-Kuk Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/747,399

(22) Filed: Dec. 30, 2003

(65) Prior Publication Data

US 2004/0166616 A1    Aug. 26, 2004

(30) Foreign Application Priority Data

Feb. 20, 2003   (KR) .................. 10-2003-0010815

(51) Int. Cl.
*H01L 21/311*   (2006.01)
(52) U.S. Cl. ...................... 438/697; 438/680
(58) Field of Classification Search .............. 438/697, 438/197, 311, 381, 309, 680, 692, 637, 700, 438/723, 724, 725, 733, 734, 740, 741, 742, 438/744, 745, 770
See application file for complete search history.

(56) References Cited

U.S. PATENT DOCUMENTS

| | | | |
|---|---|---|---|
| 6,117,743 A * | 9/2000 | Yeh et al. | 438/301 |
| 6,448,112 B1 * | 9/2002 | Lee | 438/128 |
| 6,573,574 B1 * | 6/2003 | Lee | 257/390 |
| 6,741,501 B1 * | 5/2004 | Kobayashi | 365/185.28 |
| 6,818,551 B1 * | 11/2004 | Jin et al. | 438/637 |

FOREIGN PATENT DOCUMENTS

| | | |
|---|---|---|
| JP | 5335503 | 12/1993 |
| JP | 2000138293 | 5/2000 |

* cited by examiner

*Primary Examiner*—David Nhu
(74) *Attorney, Agent, or Firm*—Volentine Francos & Whitt PLLC

(57) ABSTRACT

A method of forming a gate structure of a semiconductor device includes forming a gate insulation film and a polysilicon film on a semiconductor substrate where an active region and a field region are defined, followed by forming a buffer layer on the polysilicon film to minimize damage to the polysilicon film during a subsequent ion implantation process. The polysilicon film is made electrically conductive by the implanting of impurities into the polysilicon film. Gate patterns are then formed by etching the conductive polysilicon film and the gate insulation film. Defects, such as active pitting, associated with dual electrodes are effectively prevented because the polysilicon film is protected during the ion implanting process.

21 Claims, 11 Drawing Sheets

METHOD OF FORMING GATE ELECTRODE STRUCTURE OF A SEMICONDUCTOR DEVICE

BACKGROUND OF THE INVENTION

1. Field of the Invention

The present invention relates to a method of forming gate electrodes of semiconductor devices. More particularly, the present invention relates to a method of forming dual gate electrodes of a semiconductor device using polysilicon.

2. Description of the Related Art

In a recently developed complementary metal oxide semiconductor (CMOS) device, a buried channel is formed in a semiconductor substrate when a P-type MOS transistor is formed using polysilicon doped with N-type impurities. Additionally, a channel is formed near a surface of the semiconductor substrate when an N-type MOS transistor is formed using polysilicon doped with N-type impurities. When gate electrodes of the N-type and the P-type MOS transistors are formed using the polysilicon doped with the N-type impurities, the threshold voltage of the N-type MOS transistor may be different from that of the P-type MOS transistor. Such a difference in the threshold voltage between the N-type and P-type MOS transistors may serve as a limiting factor in the design and manufacture of the semiconductor device.

On the other hand, a semiconductor device that is to operate at a highly rapid response rate, such as a Fast SRAM or a logic device, comprises an N-type MOS transistor that includes a gate electrode composed of polysilicon doped with N-type impurities, and a P-type MOS transistor that includes a gate electrode composed of polysilicon doped with P-type impurities. This structure of the semiconductor device is generally referred to as a dual gate electrode structure.

FIGS. 1A and 1B illustrate a conventional method of forming dual gate electrodes of a semiconductor device.

Referring to FIG. 1A, an active region and a field region 10a are defined on a semiconductor substrate 10 using a general isolation process. A gate insulation film 12 is formed on the semiconductor substrate 10. An undoped polysilicon film is formed on the gate insulation film 12.

N-type impurities are selectively implanted into one portion of the undoped polysilicon film where an N-type metal oxide semiconductor (MOS) transistor will be formed. Then, P-type impurities are selectively implanted into another portion of the undoped polysilicon film where a P-type MOS transistor will be formed. Accordingly, a doped polysilicon film 14 is formed. However, the surface of the doped polysilicon film 14 is physically damaged as a result of the ion implantation processes.

Referring to FIG. 1B, the doped polysilicon film 14 is etched to form gate electrodes 16 of the N-type and P-type MOS transistors.

The above-described method for forming the dual gate electrodes is disclosed in Japanese Patent Laid-Open Publication No. 5-335503 as a way of minimizing a shifting of the threshold voltage of the P-type MOS transistor.

However, a pitting 18 of the active region of the semiconductor substrate 10 (hereinafter referred to as "active pitting 18") may occur after the dual gate electrodes are formed. More specifically, the active pitting 18 occurs at portions of the active region adjacent to the gate electrode. The active pitting 18 occurs during the etching of the doped polysilicon film 14 to form the dual gate electrodes, and as the result of an over-etching of the doped polysilicon film 14.

The semiconductor device may fail or have poor characteristics when the transistors are disposed on portions of the substrate where the active pitting is present. As a result, the generation of active pitting lowers the manufacturing yield and reliability of semiconductor devices comprising a dual gate electrode structure.

SUMMARY OF THE INVENTION

A feature of the present invention is to overcome above-described problems of the prior art. It is thus one object of the present invention to provide a method of forming a gate electrode of a semiconductor device that is free of defects such as active pitting.

According to the present invention, a gate insulation film and a polysilicon film are successively formed on a semiconductor substrate where an active region and a field region are defined, and then a buffer layer is formed on the polysilicon film.

In accordance with one aspect of the invention, a conductive polysilicon film is then formed by implanting impurities into the polysilicon film. The buffer layer is removed, and an anti-reflection layer is formed on the conductive polysilicon film. Then, gate patterns are formed by etching the anti-reflection layer, the conductive polysilicon film and the gate insulation film.

In accordance with another aspect of the invention, after the buffer layer is formed on the polysilicon film, the polysilicon film is doped by selectively implanting N-type impurities into one portion of the polysilicon film, and selectively implanting P-type impurities into another portion of the polysilicon film. After the buffer layer is removed, an anti-reflection layer is formed on the doped polysilicon film. Then, gate patterns are formed by etching the anti-reflection layer, the doped polysilicon film and the gate insulation film.

In accordance with still another aspect of the invention, the polysilicon film is doped in-situ with N-type impurities before the buffer layer is formed. Subsequently, the polysilicon film is doped with P-type impurities by selectively implanting the P-type impurities into a portion of the polysilicon film. The buffer layer is removed, and an anti-reflection layer is formed on the doped polysilicon film. Then, gate patterns are formed by etching the anti-reflection layer, the doped polysilicon film and the gate insulation film.

Furthermore, in accordance with still another aspect of the invention while the buffer layer is disposed on the polysilicon film, the polysilicon film is doped by selectively implanting N-type impurities into a portion of the polysilicon film. Then, gate patterns are formed by etching the polysilicon film and the gate insulation film. Next, P-type impurities are selectively implanted into one of the gate patterns to form a P-type gate electrode.

According to the present invention, the buffer layer minimizes damage to the polysilicon film, used for forming dual gate electrodes, during an ion implanting process, as well as during subsequent ashing and stripping processes. Therefore, defects, such as active pitting, are effectively prevented.

BRIEF DESCRIPTION OF THE DRAWINGS

The above and other advantages of the present invention will become more apparent from the following detailed description of the preferred embodiments thereof made with reference to the accompanying drawings, in which.

DETAILED DESCRIPTION OF THE PREFERRED EMBODIMENTS

The preferred embodiments of the present invention will be described in detail hereinafter with reference to the accompanying drawings.

FIGS. 2A to 2H illustrate a first embodiment of a method of forming dual gate electrodes of a semiconductor device according to the present invention.

Figure 1A:
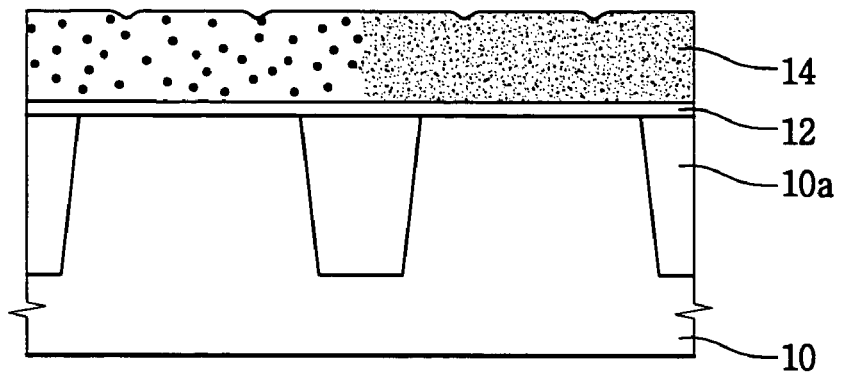
FIGS. 1A and 1B are cross-sectional views of a semiconductor substrate, illustrating a conventional method of manufacturing a dual gate structure of a semiconductor device.
Figure 1B:
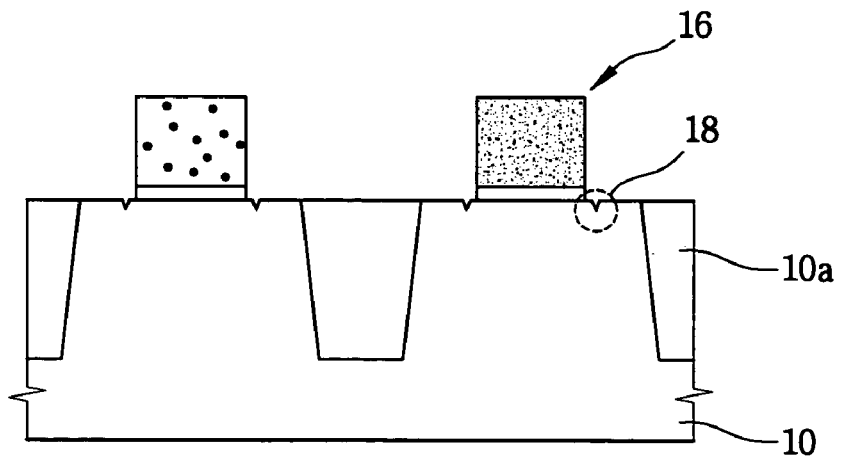
Figure 2A:
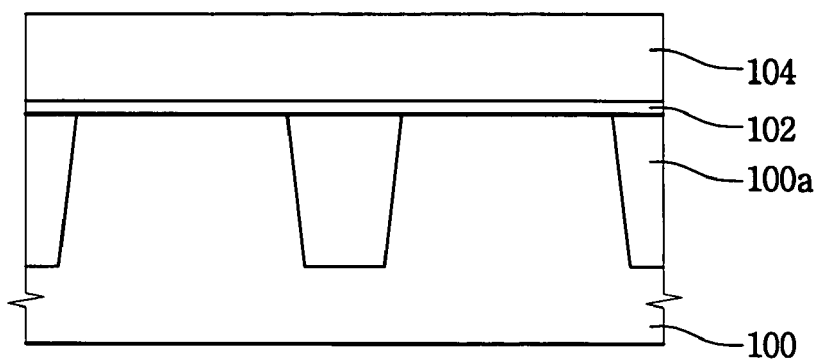
FIGS. 2A to 2H are cross-sectional views of a semiconductor substrate, illustrating one embodiment of a method of forming dual gate electrodes of a semiconductor device according to the present invention.

Referring to FIG. 2A, an active region and a field region 100a are defined on a semiconductor substrate 100 using an isolation process, such as a shallow trench isolation (STI) process.

More specifically, a pad oxide film, a nitride film and a high temperature oxide (HTO) film are successively formed on the semiconductor substrate 100. An anti-reflection layer (ARL) comprising silicon oxynitride (SiON) is formed on the HTO film. Then, the HTO film is etched using a photolithography process to form an HTO pattern. A nitride film pattern and a pad oxide film pattern are formed by etching the nitride film and the pad oxide film using the HTO pattern as an etching mask. Then, a trench is formed in the semiconductor substrate 100 by etching the semiconductor substrate 100 to a predetermined depth.

An oxide film is formed on the semiconductor substrate 100 using a chemical vapor deposition (CVD) process to fill the trench. The oxide film is etched using a chemical mechanical polishing (CMP) process until the nitride film pattern is exposed, whereby a field oxide film is formed in the trench. The nitride film pattern is removed via a stripping process using a nitric acid.

An N-type metal oxide semiconductor (MOS) transistor and a P-type MOS transistor will be formed on the semiconductor substrate 100.

First, a gate insulation film 102 is formed on the semiconductor substrate 100 where the active region and the field region 100a are defined. The gate insulation film 102 has a small thickness of about 30 to about 100 Å.

Then, an undoped polysilicon film 104 is formed on the gate insulation film 102.

Figure 2B:
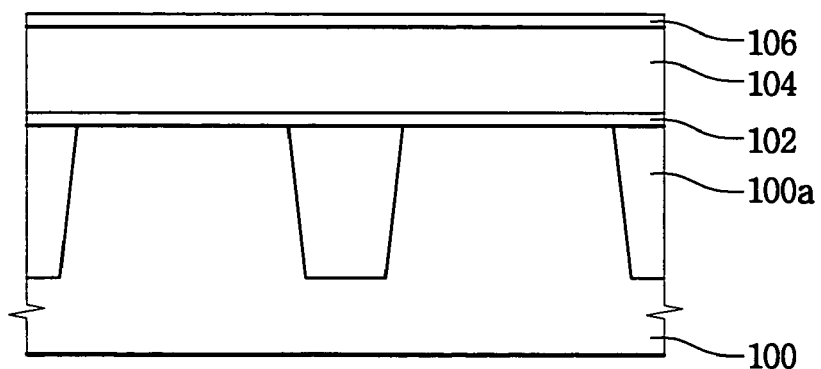

Referring to FIG. 2B, a buffer layer 106 is formed on the undoped polysilicon film 104 to minimize the damage to the polysilicon film 104 during subsequent ion implantation, ashing and stripping processes. The buffer layer 106 has a thickness of about 50 to about 200 Å. If the buffer layer 106 is too thin, the polysilicon film 104 will be damaged because the buffer layer 106 would be completely consumed during the ion implantation, ashing and stripping process. On the other hand, if the buffer layer 106 is too thick, ions will not be implanted in the polysilicon film 104 during the ion implantation process. Additionally, the buffer layer 106 is of a material that will not be etched during the ashing and stripping processes such that the buffer layer 106 will prevent the polysilicon film 104 from being damaged during the ashing and stripping process.

The buffer layer 106 advantageously comprises silicon oxide. The silicon oxide reduces the risk of the formation of cracks at the boundary between the polysilicon film 104 and the buffer layer 106. In this case, silicon oxide can be formed on the polysilicon film 104 using a CVD process or a thermal oxidation process. When silicon oxide is formed using the thermal oxidation process, some of the polysilicon film 104 is consumed. As a result, the structure of the polysilicon film 104 may be damaged. Thus, the silicon oxide is preferably deposited on the polysilicon film 104 using the CVD process because the CVD process will not affect the structure of the polysilicon film 104. For example, the silicon oxide for the buffer layer 106 is deposited on the polysilicon film 104 using a CVD process at a temperature of about 700 to about 800° C. and under a pressure of about 80 to about 100 Pa. In this case, the CVD process is performed using silane ($SiH_4$) and nitrous oxide ($N_2O$) as source gases.

Figure 2C:
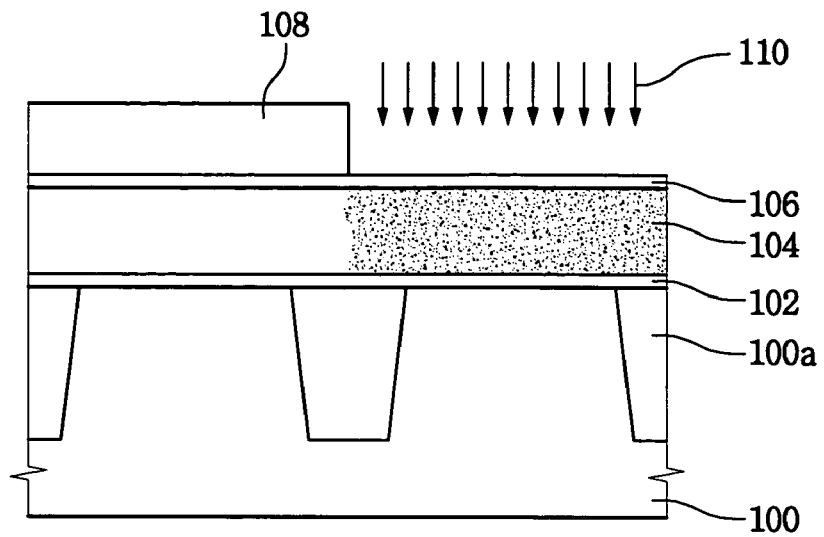

Referring to FIG. 2C, a first photoresist film (not shown) is formed on the buffer layer 106. The first photoresist film is patterned using an exposure process and a developing process to form a first photoresist pattern 108 on the buffer layer 106. The first photoresist pattern 108 selectively exposes one portion of the buffer layer 106 where the N-type MOS transistor will be formed.

N-type impurities 110 are implanted into a portion of the polysilicon film 104 using the first photoresist pattern 108 as a mask. Thus, one portion of the polysilicon film 104, where the N-type MOS transistor will be formed, is doped with the N-type impurities 110. The N-type impurities 110 comprise phosphorus (P). At this time, another portion of the polysilicon film 104, where the P-type MOS transistor will be formed, is not doped.

Figure 2D:
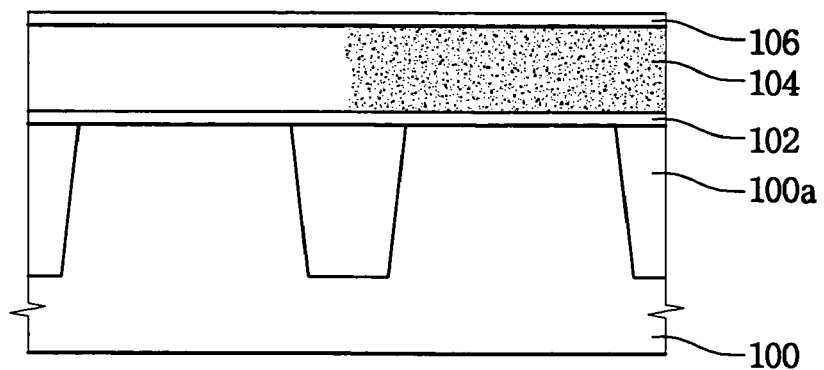

Referring to FIG. 2D, the first photoresist pattern 108 is removed using an ashing process and a stripping process. In general, the ashing process is performed using a plasma of ozone ($O_3$), and the stripping process is executed using sulfuric acid and SC 1. The SC 1 is a solution of ammonium hydroxide ($NH_4OH$), hydrogen peroxide ($H_2O_2$) and deionized water ($H_2O$).

In the prior art, the polysilicon film is damaged due to the ion implantation process, whereupon the etching rate of the polysilicon film 104 is increased. Accordingly, the chemicals and etching gases employed during the ashing and the stripping processes for removing the first photoresist pattern may over-etch the damaged polysilicon film. The over-etched portion of the polysilicon film constitutes a defect that causes subsequent processes to fail.

On the other hand, according to the present invention, the buffer layer 106 is disposed on the polysilicon film 104 when the ion implantation process for implanting the N-typed impurities 110 and the ashing and stripping processes for removing the first photoresist pattern 108 are performed. That is, the polysilicon film 104 is not exposed during these processes. Accordingly, damage to the polysilicon film 104 is minimized during the ion implantation process. Additionally, the chemicals and the etching gases used in the ashing and stripping processes do not directly contact the polysilicon film 104 due to the buffer layer 106. Hence, the risk of over-etching the polysilicon film 104 is minimal.

Figure 2E:
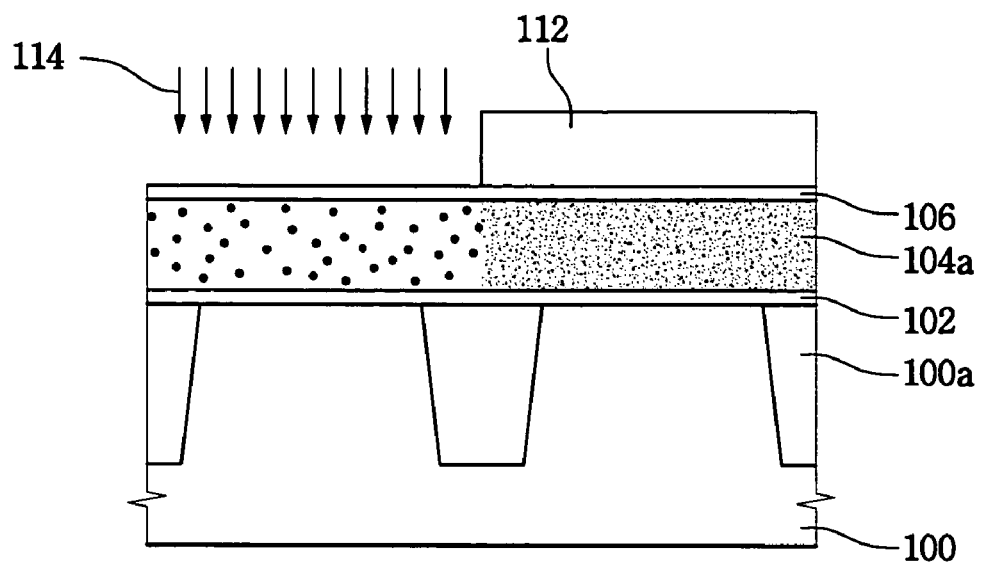

Referring to FIG. 2E, after a second photoresist film (not shown) is formed on the buffer layer 106, the second photoresist film is patterned to form a second photoresist pattern 112 using an exposure process and a developing process. The second photoresist pattern 112 selectively exposes another portion of the buffer layer 106 where the P-type MOS transistor will be formed.

P-type impurities 114 are implanted into the portion of the polysilicon film 104, where the P-typed MOS transistor will be formed, using the second photoresist pattern 112 as a mask. The P-type impurities comprise boron (B). Thus, the portion of the polysilicon film 104 doped with the P-type impurities 114 becomes electrically conductive.

The second photoresist pattern is then removed to from the buffer layer using an ashing process and a stripping process. Accordingly, the forming of a doped polysilicon film 104a is completed.

When the polysilicon film 104 is implanted with the P-type impurities 114, the polysilicon film 104 is not exposed because the buffer layer 106 is disposed on the polysilicon film 104. Hence, damage to the polysilicon film 104 can be minimized during the process of implanting the P-type impurities 114. In addition, the risk of over-etching the polysilicon film 104 is minimized because the buffer layer 106 prevents the chemicals and etching gases used in the ashing and stripping processes for removing the second photoresist pattern 112 from contacting the polysilicon film 104.

Figure 2F:
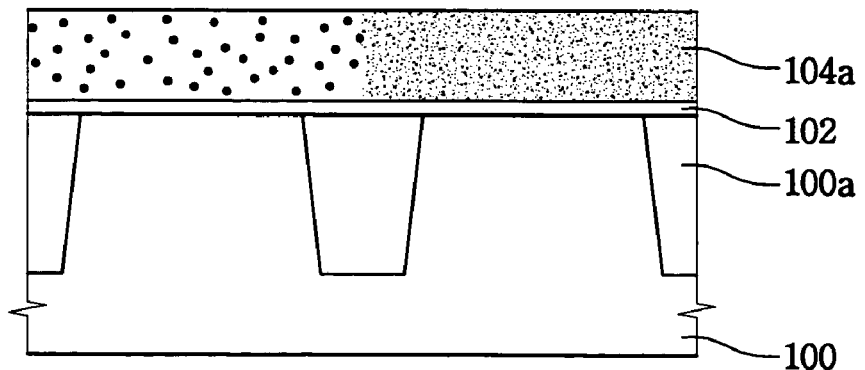

Referring now to FIG. 2F, the buffer layer 106 is removed using a wet etching process in order to minimize damage to the doped polysilicon film 104a. In the case in which the buffer layer 106 is of silicon oxide, the buffer layer 106 can be removed using LAL or BOE.

According to the method of the present invention, the buffer layer 106 can be partially removed by the processes used to remove the second photoresist pattern 112. In this case, the above-described wet etching process is carried out to remove the remainder of the buffer layer 106. Alternatively, the buffer layer 106 can be completely removed from the doped polysilicon film 104a by carrying out the ashing and stripping processes, for removing the second photoresist pattern 112, under appropriate processing conditions. That is, the buffer layer 106 can be removed with the second photoresist pattern 112 without the need for an additional process such as an wet etch process.

Figure 2G:
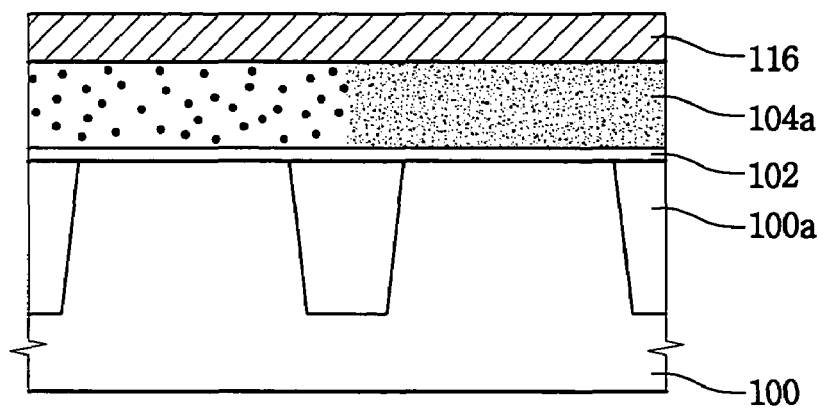

Referring to FIG. 2G, an ARL 116 is formed on the doped polysilicon film 104a. The ARL 116 prevents light from scattering during a subsequent photo process for forming a third photoresist pattern. The ARL 116 comprises silicon nitride or silicon oxynitride.

Figure 2H:
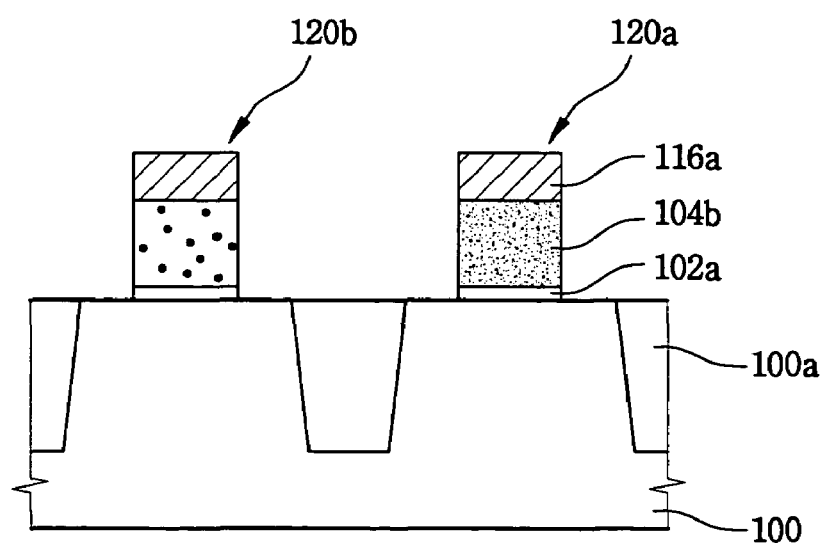

Referring to FIG. 2H, after a third photoresist film (not shown) is formed on the ARL 116, the third photoresist film is patterned to form the third photoresist pattern (not shown) using an exposure process and a developing process. The third photoresist pattern defines a region where a gate electrode will be formed. The ARL 116 is etched to form an ARL pattern 116a using the third photoresist pattern as an etching mask. The third photoresist pattern is removed using an ashing process and a stripping process.

The doped polysilicon film 104a and the gate insulation film 102 are etched to form a gate insulation film pattern 102a and a doped polysilicon film pattern 104b using the ARL pattern 116a as an etching mask. As a result, dual gate electrodes 120a and 120b comprising the gate insulation film pattern 102a and the doped polysilicon film pattern 104b are formed on the semiconductor substrate 100. In this case, an N-type gate electrode 120a of the N-type MOS transistor is formed at one portion of the semiconductor substrate 100, and a P-type gate electrode 120b of the P-type transistor is formed at another portion of the semiconductor substrate 100. The N-type gate electrode 120a includes one portion of the polysilicon film pattern 104b doped with the N-type impurities, and the P-type gate electrode 120b includes another portion of the polysilicon film pattern 104b doped with the P-type impurities.

In the present embodiment, the doped polysilicon film 104a is not damaged, before the etching process for forming the dual gate electrodes 120a and 120b is performed, e.g., is not damaged by the ion implantation processes, and/or the ashing and stripping processes. Accordingly, the doped polysilicon film 104a is not over-etched when the etching process for forming the dual gate electrodes 120a and 120b is executed, i.e., active pitting is prevented. Therefore, a reliable semiconductor device having dual gate electrodes 120a and 120b can be formed.

FIGS. 3A to 3D illustrate a second embodiment of a method of forming dual gate electrodes of a semiconductor device according to the present invention. This embodiment is identical to that of the above-described first embodiment except with respect to the steps of implanting impurities into the polysilicon layer.

Figure 3A:
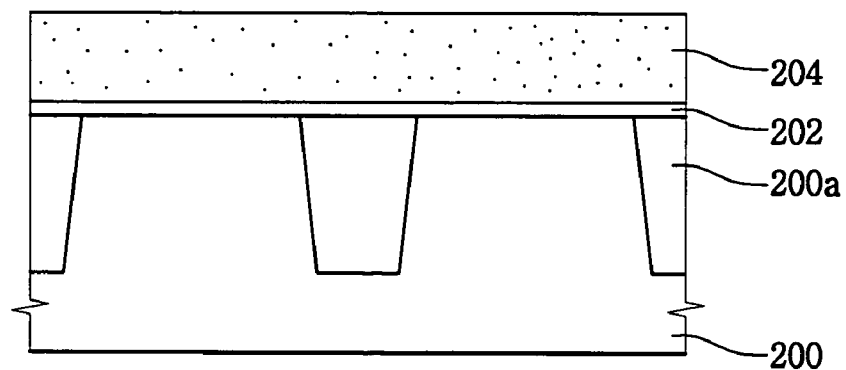
FIGS. 3A to 3D are cross-sectional views of a semiconductor substrate, illustrating another embodiment of a method of forming dual gate electrodes of a semiconductor device according to the present invention.

Referring to FIG. 3A, an active region and a field region 200a are defined on a semiconductor substrate 200 using an isolation process, such as an STI process. An N-type MOS transistor and a P-type MOS transistor will be formed on the semiconductor substrate 200.

First, a thin gate insulation film 202 is formed on the semiconductor substrate 200 where the active region and the field region 200a are defined. The gate insulation film 202 has a thickness of about 30 to about 100 Å.

Next, a polysilicon film doped with N-type impurities 204 is formed on the gate insulation film 202 using an in-situ doping process.

Figure 3B:
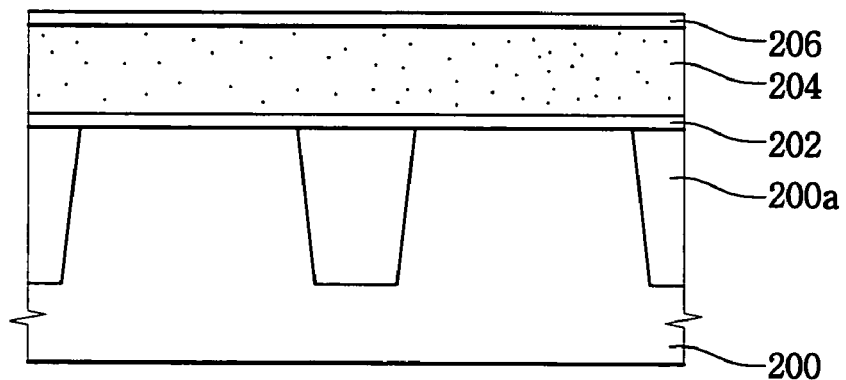

Referring to FIG. 3B, a buffer layer 206 is formed on the polysilicon film doped with the N-typed impurities 204 to minimize damage to the doped polysilicon film during subsequent ion implantation, ashing and stripping processes. The buffer layer 206 has a thickness of about 50 to about 200 Å. The buffer layer 206 is of silicon oxide formed using a CVD process or a thermal oxidation process.

Figure 3C:
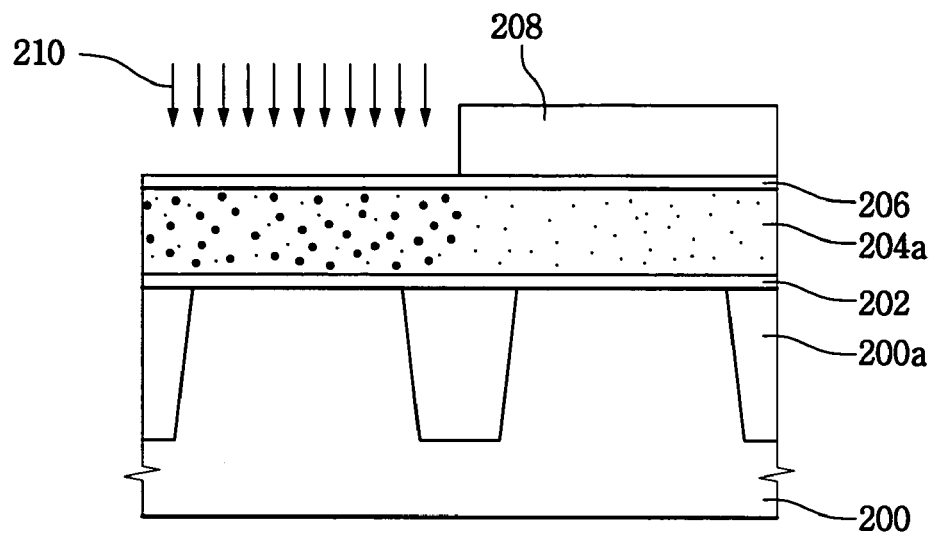

Referring to FIG. 3C, after a photoresist film (not shown) is formed on the buffer layer 206, the photoresist film is patterned using an exposure process and a developing process to form a photoresist pattern 208 on the buffer layer 206. The photoresist pattern 208 selectively exposes one portion of the buffer layer 206 where the P-type MOS transistor will be formed.

P-type impurities 210 are implanted into a portion of the polysilicon film doped with the N-typed impurities 204 using the photoresist pattern 208 as a mask. By this process, the concentration of the P-type impurities 210 is made to be higher than that of the N-type impurities. That is, the P-type impurities 210 dominate at the portion of the doped polysilicon film 204a where the P-type MOS transistor will be formed. The photoresist pattern 208 is removed using an ashing process and a stripping process.

According to the second embodiment, the polysilicon film can be doped with the N-type impurities and the P-type impurities using one photolithography process. That is, the forming of the doped polysilicon film 204a is simpler than in the first embodiment.

Figure 3D:
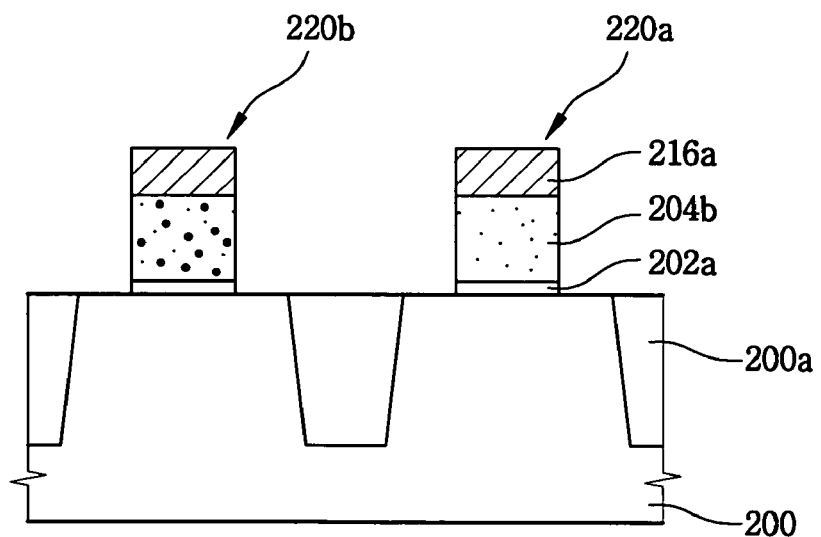

Referring to FIG. 3D, processes for manufacturing the dual gate electrodes, identical to those shown in FIGS. 2D to 2G, are performed. That is, after the buffer layer 206 is removed, an ARL is formed on the doped polysilicon film 204a. The ARL is patterned to form an ARL pattern 216a. The doped polysilicon film 204a and the gate insulation film 202 are successively etched using the ARL pattern 216a as an etching mask to form dual gate electrodes 220a and 220b. That is, at this time, an N-type gate electrode 220a of the N-type MOS transistor is formed at one portion of the semiconductor substrate 200, and a P-type gate electrode 220b of the P-type transistor is formed at another portion of the semiconductor substrate 200. The N-type gate electrode 220a includes a respective portion of the gate insulation film pattern 202a and a portion of the polysilicon film pattern 204a doped with N-type impurities. The P-type gate electrode 220b includes a respective portion of the gate insulation film pattern 202a and a portion of the polysilicon film pattern 204b doped with the N-type and P-type impurities.

FIGS. 4A to 4G illustrate a third embodiment of a method of forming dual gate electrodes of a semiconductor device according to the present invention.

Figure 4A:
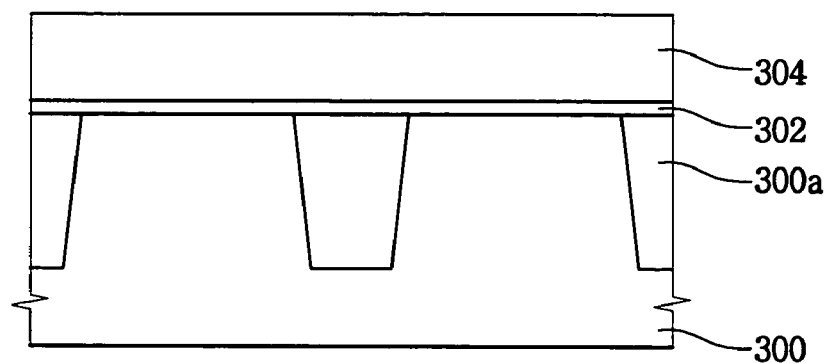
FIGS. 4A to 4G are cross-sectional views of a semiconductor substrate, illustrating still another embodiment of a method of forming dual gate electrodes of a semiconductor device according to the present invention.

Referring to FIG. 4A, an active region and a field region 300a are defined on a semiconductor substrate 300 using an isolation process, such as an STI process. An N-type MOS transistor and a P-type MOS transistor will be formed on the semiconductor substrate 300.

First, a thin gate insulation film 302 is formed on the semiconductor substrate 300 where the active region and the field region 300a are defined. The gate insulation film 302 has a thickness of about 30 to about 100 Å. Then, an undoped polysilicon film 304 is formed on the gate insulation film 302.

Figure 4B:
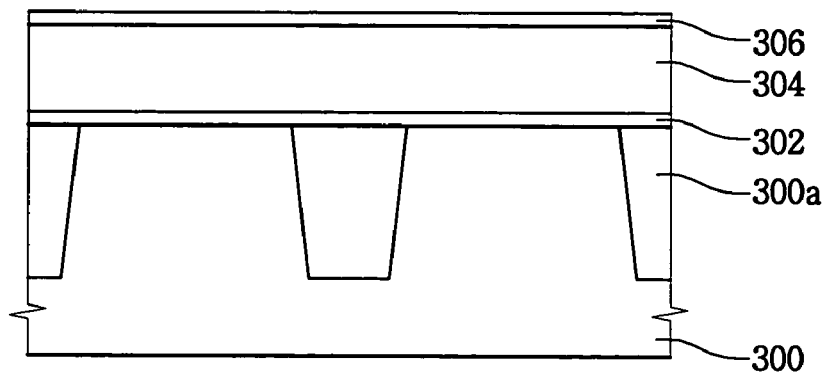

Referring to FIG. 4B, a buffer layer 306 is formed on the undoped polysilicon film 304 in order to minimize damage to the polysilicon film 304 during subsequent ion implantation, ashing and stripping processes. The buffer layer 306 has a thickness of about 50 to about 200 Å. The buffer layer 306 comprises silicon oxide, and is formed using a CVD process or a thermal oxidation process.

Figure 4C:
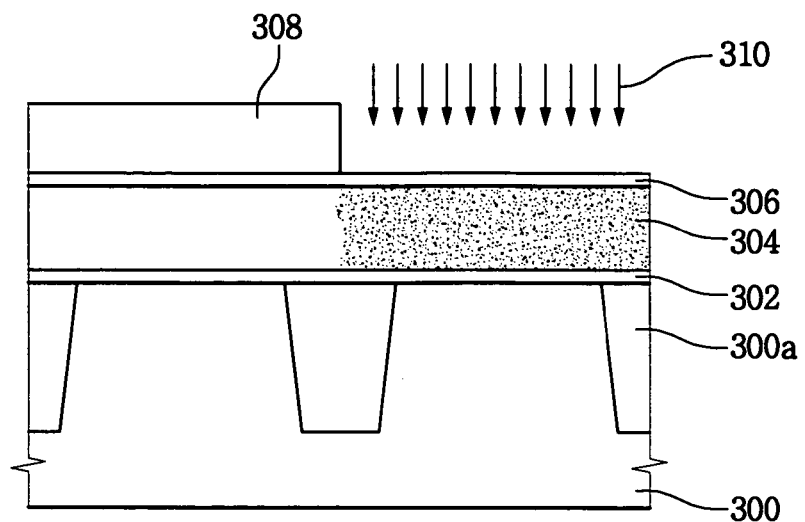

Referring to FIG. 4C, a first photoresist film (not shown) is formed on the buffer layer 306. The first photoresist film is patterned using an exposure process and a developing process to form a first photoresist pattern 308 on the buffer layer 306. The first photoresist pattern 308 selectively exposes one portion of the buffer layer 306 where the N-type MOS transistor will be formed.

N-type impurities 310 are implanted into a portion of the polysilicon film 304 using the first photoresist pattern 308 as a mask. Hence, one portion of the polysilicon film 304, where the N-type MOS transistor will be formed, is doped with the N-type impurities 310. At this time, another portion of polysilicon film 304, where the P-type MOS transistor will be formed, is not doped.

The first photoresist pattern 308 is removed using an ashing process and a stripping process. The buffer layer 306 prevents the polysilicon film 304 from being exposed during these processes. Thus, damage to the polysilicon film 304 can be minimized during the ion implantation process for implanting the N-type impurities 310, and the ashing and stripping processes for removing the first photoresist pattern 308.

Figure 4D:
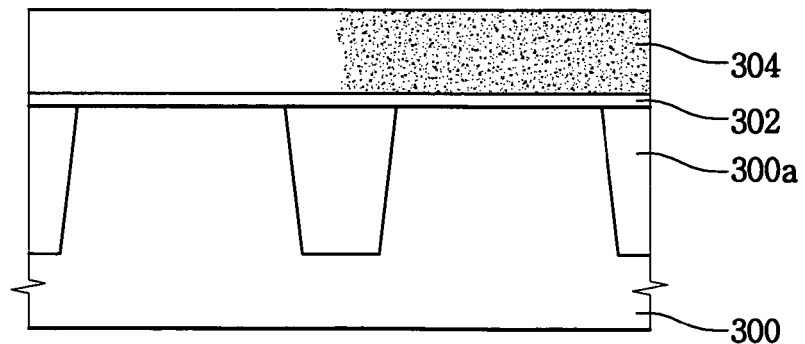

Referring to FIG. 4D, the buffer layer 306 formed on the polysilicon film 304 is removed. The buffer 306 is advantageously removed using a wet etching process to minimize the risk of damaging the polysilicon film 304. When the buffer layer 306 is of silicon oxide, the buffer layer 306 can be removed using LAL or BOE.

The buffer layer 306 can be partially removed by the processes used to remove the first photoresist pattern 308. In this case, the above-described wet etching process is carried out to remove the remainder of the buffer layer 306. Alternatively, the buffer layer 306 can be completely removed from the polysilicon film 304 by carrying out the ashing and stripping processes under appropriate processing conditions. That is, the buffer layer 306 can be removed with the photoresist pattern 308 without the need for an additional process such as a wet etch process. Alternatively, the buffer layer 306 can be removed during ashing and stripping processes for removing subsequently formed photoresist patterns.

Figure 4E:
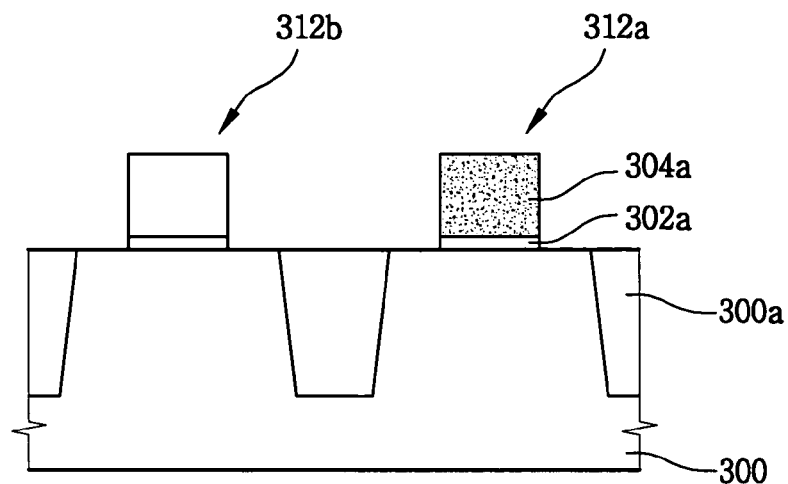

Referring to FIG. 4E, the polysilicon film 304 and the gate insulation film 302 are etched to from gate patterns each including respective portions of a gate insulation film pattern 302a and a polysilicon film pattern 304a. One of these gate patterns will be formed into a gate electrode of the N-type MOS transistor while the other gate pattern will be formed into a gate electrode of the P-type MOS transistor. Hereinafter, the gate pattern of the N-type MOS transistor will be referred to as an N-type gate pattern 312a, and the gate pattern of the P-type MOS transistor will be referred to as a P-type gate pattern 312b.

More specifically, after a second photoresist film (not shown) is formed on the polysilicon film 304, the second photoresist film is patterned to form a second photoresist pattern (not shown) using an exposure process and a developing process. The second photoresist pattern covers portions of the polysilicon film 304 where the N-type and the P-type MOS transistors will be formed. The polysilicon film 304 and the gate oxide film 302 are etched using the second photoresist pattern as an etching mask so that the N-type gate pattern 312a and the P-type gate pattern 312b are formed on the semiconductor substrate 300. In this case, the N-type impurities 310 are already present in the N-type gate pattern 312a so that the N-type gate pattern 312a is electrically conductive.

Figure 4F:
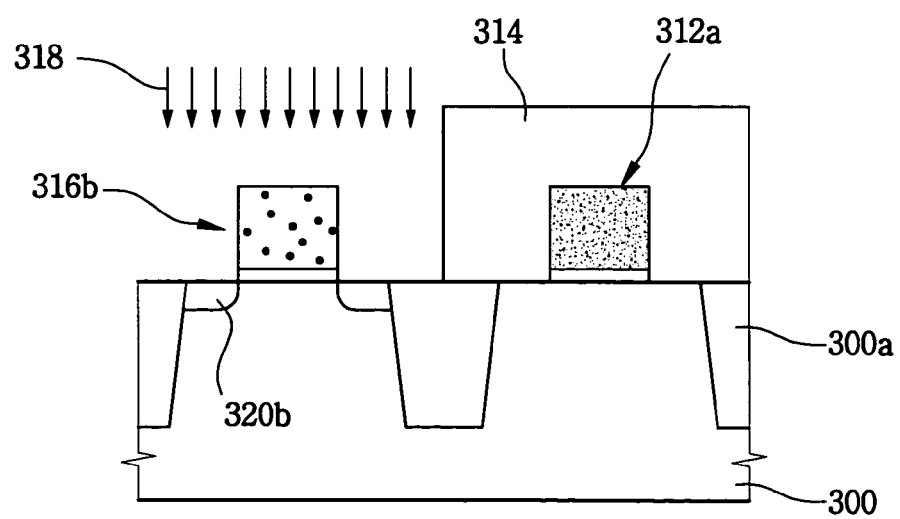

Referring to FIG. 4F, a third photoresist pattern 314 is formed on the semiconductor substrate 300. The third photoresist pattern 314 covers the N-type gate pattern 312a to selectively expose a portion of the semiconductor substrate 300 where the P-type MOS transistor will be formed.

P-type impurities 318 are implanted into the P-type gate pattern 312b and into a portion of the substrate 300 adjacent the P-type gate pattern 312b using the third photoresist pattern 314 as a mask. As a result, the doped portion of the substrate 300 adjacent the P-typed gate pattern 312b serves as a P-type source/drain 320b. Additionally, the P-type impurities form the P-type gate pattern 312b into a P-type gate electrode 316b, i.e., and an electrical conductor. This technique of simultaneously forming the P-typed gate electrode with the P-type source/drain offers simplicity in the method of forming of dual gate electrodes can be simplified.

Then, the third photoresist pattern 314 is removed using an ashing process and a stripping process.

Figure 4G:
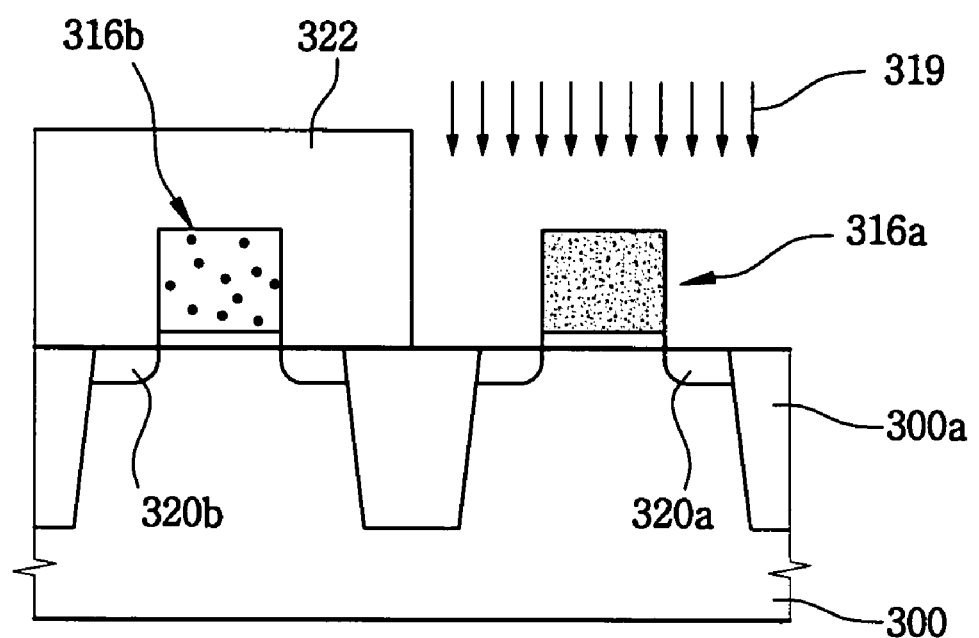

Referring to FIG. 4G, a fourth photoresist pattern 322 is formed on the semiconductor substrate 300. The fourth photoresist pattern 322 covers the P-type gate electrode 316b to selectively expose a portion of the semiconductor substrate 300 where the N-type MOS transistor will be formed.

N-type impurities 319 are implanted into the N-type gate pattern 312a and into a portion of the substrate 300 adjacent the N-type gate pattern 312a using the fourth photoresist pattern 322 as a mask. Therefore, the portion of the substrate 300 adjacent the N-type gate pattern 312a can serve as an N-type source/drain 320a. Also, the additional N-type impurities implanted into the N-type gate pattern 312a complete the forming of N-type gate electrode 316a.

Then, the fourth photoresist pattern 322 is removed using an ashing process and a stripping process.

Note, although the N-type gate electrode 316a has been described as being formed after the P-type gate electrode 316b, the order can be reversed. That is, the process steps shown in and described with reference to FIG. 4F can be performed before those represented by FIG. 4G.

According to the present invention as described above, a buffer layer is disposed on the doped polysilicon film when an ion implantation process using a photoresist pattern as a mask is performed to implant impurities into a portion of the polysilicon layer, as well as when the subsequent ashing and stripping processes for removing the photoresist pattern are performed. Thus, the risk of damage to the polysilicon film is minimized during the ion implantation, ashing and stripping processes.

Accordingly, the doped polysilicon film is substantially damage free before the etching process for forming the dual gate electrodes is performed. Therefore, the doped polysilicon film will not be over-etched when the etching process for forming the dual gate electrodes is executed, i.e., active pitting is prevented. As a result, a reliable semiconductor device having dual gate electrodes can be formed.

Finally, it is noted that modifications to and variations of the preferred embodiments will become apparent to persons skilled in the art in light of the teachings of the present specification. It is therefore to be understood that all such changes and modifications that fall within the scope of the appended claims are seen to be with in the true spirit of the invention.

What is claimed is:

1. A method of forming gate electrode structure of a semiconductor device, comprising:
    forming a gate insulation film and a polysilicon film on a semiconductor substrate where an active region and a field region are defined;
    forming a buffer layer on the polysilicon film;
    subsequently doping the polysilicon film by implanting impurities into the polysilicon film, whereby the polysilicon film becomes electrically conductive;
    subsequently removing the buffer layer;
    subsequently forming an anti-reflection layer on the conductive polysilicon film; and
    forming gate patterns on the semiconductor substrate by etching the anti-reflection layer, the conductive polysilicon film and the gate insulation film.

2. The method of claim 1, wherein said forming a buffer layer comprises forming a layer of silicon oxide on the polysilicon film.

3. The method of claim 2, wherein the buffer layer is formed using a chemical vapor deposition process.

4. The method of claim 1, wherein the buffer layer is formed to a thickness of about 50 to about 200 Å.

5. The method of claim 1, wherein said doping of the polysilicon film comprises:
    forming a first photoresist pattern on the buffer layer that exposes a portion of the buffer layer,
    implanting N-type impurities into a first portion of the polysilicon film using the first photoresist pattern as a mask,
    removing the first photoresist pattern,
    forming a second photoresist pattern on the buffer layer that exposes a portion of the buffer layer, and
    implanting P-type impurities into a portion of the polysilicon film using the second photoresist pattern as a mask.

6. A method of forming a gate electrode structure of a semiconductor device, comprising:
    forming a gate insulation film and a polysilicon film on a semiconductor substrate where an active region and a field region are defined;
    forming a buffer layer on the polysilicon film;
    subsequently doping the polysilicon film by implanting N-type impurities into one portion of the polysilicon film, and implanting P-type impurities into another portion of the polysilicon film;
    subsequently removing the buffer layer;
    subsequently forming an anti-reflection layer on the doped polysilicon film; and
    forming gate patterns on the semiconductor substrate by etching the anti-reflection layer, the doped polysilicon film and the gate insulation film.

7. The method of claim 6, wherein said forming a buffer layer comprises forming a layer of silicon oxide on the polysilicon film.

8. The method of claim 7, wherein the buffer layer is formed using a chemical vapor deposition process.

9. The method of claim 6, wherein the buffer layer is formed to a thickness of about 50 to about 200 Å.

10. The method of claim 6, wherein said doping of the polysilicon film comprises: forming a first photoresist pattern on the buffer layer, that exposes a portion of the buffer layer corresponding to an N-type gate electrode,
    implanting the N-type impurities into said one portion of the polysilicon film using the first photoresist pattern as a mask, and
    removing the first photoresist pattern.

11. The method of claim 10, wherein said doping of the polysilicon film comprises:
    forming a second photoresist pattern on the buffer layer, that exposes a portion of the buffer layer corresponding to a P-type gate electrode, and
    implanting the P-type impurities into said another portion of the polysilicon film using the second photoresist pattern as a mask; and
    further comprising removing the second photoresist pattern.

12. The method of claim 11, wherein the buffer layer and the second photoresist pattern are removed using the same process.

13. The method of claim 6, wherein the buffer layer is removed using a wet etching process.

14. The method of claim 6, wherein said forming of an anti-reflection layer comprises forming a layer of silicon nitride or silicon oxynitride on the doped polysilicon film.

15. A method of forming a gate electrode structure of a semiconductor device, comprising:
    forming a gate insulation film on semiconductor substrate where an active region and a field region are defined;
    forming a polysilicon film on the gate insulation film, and doping the polysilicon film in-situ with N-type impurities;
    subsequently forming a buffer layer on the polysilicon film;
    subsequently doping the polysilicon film by selectively implanting P-type impurities into a portion of the polysilicon film;
    subsequently removing the buffer layer;
    forming an anti-reflection layer on the polysilicon film doped with the N-type and P-type impurities; and forming gate patterns by etching the anti-reflection layer, the doped polysilicon film and the gate insulation film.

16. The method of claim 15, wherein said forming a buffer layer comprises forming a layer of silicon oxide on the polysilicon film.

17. The method of claim 15, wherein the buffer layer is formed to a thickness of about 50 to about 200 Å.

18. A method of forming a gate electrode of a semiconductor device comprising:

forming a gate insulation film and a polysilicon film on a semiconductor substrate where an active region and a field region are defined;

forming a buffer layer on the polysilicon film to prevent the polysilicon film from being damaged;

subsequently doping a portion of the polysilicon film by selectively implanting N-type impurities into the polysilicon film;

forming gate patterns by etching the polysilicon film, and the gate insulation film, one of the gate patterns including the portion of the polysilicon film doped with the N-type impurities; and carrying out a P-type ion implantation process comprising implanting P-type impurities into another one of the gate patterns, that does not include the portion of the polysilicon film doped with the N-type impurities during said selective implanting of the N-type impurities, to form a P-type gate electrode.

19. The method of claim 18, and further comprising implanting N-type impurities into said one of the gate patterns in order to form an N-type gate electrode.

20. The method of claim 18, wherein said forming a buffer layer comprises forming a layer of silicon oxide on the polysilicon film.

21. The method of claim 18, wherein said P-type ion implantation process comprises simultaneously implanting P-type impurities into said another one of the gate patterns and into a portion of the semiconductor substrate adjacent said another one of the gate patterns, whereby the P-type gate electrode and a P-type source/drain are formed at the same time.

* * * * *